(12) United States Patent
Chen et al.

(10) Patent No.: US 6,518,156 B1
(45) Date of Patent: Feb. 11, 2003

(54) CONFIGURABLE NANOSCALE CROSSBAR ELECTRONIC CIRCUITS MADE BY ELECTROCHEMICAL REACTION

(75) Inventors: Yong Chen, Palo Alto, CA (US); R. Stanley Williams, Mountain View, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/558,955

(22) Filed: Apr. 25, 2000

Related U.S. Application Data

(63) Continuation-in-part of application No. 09/280,225, filed on Mar. 29, 1999, now Pat. No. 6,314,019.

(51) Int. Cl.$^7$ .............................................. H01L 21/44

(52) U.S. Cl. ..................... 438/597; 438/598; 438/957

(58) Field of Search ................................ 438/597, 598, 438/684, 685, 688, 957; 365/158, 171

(56) References Cited

U.S. PATENT DOCUMENTS

| | | | | |
|---|---|---|---|---|
| 3,975,623 | A | 8/1976 | Weinberger | 235/152 |
| 4,208,728 | A | 6/1980 | Blahut et al. | 365/154 |
| 5,475,341 | A | 12/1995 | Reed | 327/566 |
| 5,519,629 | A | 5/1996 | Snider | 364/490 |
| 5,640,343 | A | 6/1997 | Gallagher et al. | 365/171 |
| 5,646,418 | A | 7/1997 | Frazier et al. | 257/4 |
| 5,665,618 | A | 9/1997 | Meyer et al. | 438/172 |
| 5,729,752 | A | 3/1998 | Snider et al. | 395/800 |
| 5,790,771 | A | 8/1998 | Culbertson et al. | 395/182.01 |
| 6,438,025 | B1 * | 8/2002 | Skarupo | 365/158 |

OTHER PUBLICATIONS

J.R. Heath et al, "A Defect–Tolerant Computer Architecture: Opportunities for Nanotechnology", Science, vol. 280, pp. 1716–1721 (Jun. 12, 1998).

L. Guo et al, "Nanosclae Silicon Field Effect Transistors Fabricated Using Imprint Lithography", Applied Physics Letters, vol. 71, pp. 1881–1883 (Sep. 29, 1997).

A.M. Morales et al, "A Laser Ablation Method For The Synthesis Of Crystalline Semicondutor Nanowires", Science, vol. 279, pp. 208–268 (Jan. 9, 1998).

J.R. Heath et al, "A Liquid Solution Synthesis Of Single Crystal Germanium Quantum Wires", Chemical Physics Letters, vol. 208, No. 3, 4, pp. 263–268 (Jun. 11, 1993).

(List continued on next page.)

*Primary Examiner*—Matthew Smith
*Assistant Examiner*—Craig P. Lytle

(57) ABSTRACT

Configurable electronic circuits comprise arrays of crosspoints of one layer of metal/semiconductive nanoscale lines crossed by a second layer of metal/semiconductive nanoscale lines, with a configurable layer between the lines. Methods are provided for altering the thickness and/or resistance of the configurable layer by oxidation or reduction methods, employing a solid material as the configurable layer. Specifically a method is provided for configuring nanoscale devices in a crossbar array of configurable devices comprising arrays of cross-points of a first layer of nanoscale lines comprising a first metal or a first semiconductor material crossed by a second layer of nanoscale lines comprising a second metal or a second semiconductor material. The method comprises: (a) forming the first layer on a substrate; (b) forming a solid phase of a configurable material on the first layer at least in areas where the second layer is to cross the first layer; (c) forming the second layer on the configurable material, over the first layer; and (d) changing a property of the configurable material to thereby configure the nanoscale devices.

18 Claims, 5 Drawing Sheets

OTHER PUBLICATIONS

V.P. Menon et al, "Fabrication and Evaluation Of Nanoelectrode Ensembles", Analytical Chemistry, vol. 67, pp. 1920–1928 (Jul. 1, 1995).

L. Guo et al, "A Silicon Single–Electron Transistor Memory Operating At Room Temperature", Science, vo. 275, pp. 649–651 (Jan. 31, 1997).

S.J. Tans et al, "Room–Temperature Transistor Based On A Single Carbon Nanotube", Nature, vol. 393, pp. 49–52 (May 7, 1998).

K.K. Likharev, "Correlated Discrete Transfer Of Single Electrons In Ultrasmall Tunnel Junctions", IBM Journal of Research and Development, vol. 32, No. 1, pp. 144–158 (Jan. 1998).

R.E. Jones Jr., et al, "Ferroelectric Non–Volatile Memories For Low–Voltage, Low–Power Applications", Thin Solid Films, vol. 270, pp. 584–588 (Dec. 1, 1995).

D.B. Amabilino et al, "Aggregation Of Self–Assembling Branched [n]–Rotaxanes", New Journal of Chemistry, vol. 22, No. 9, pp. 959–972 (Sep. 11, 1998).

T. Vossmeyer et al, "Combinatorial Approaches Toward Patterning Nanocrystals", Journal of Applied Physics, vol. 84, No. 7, pp. 3664–3670 (Oct. 1, 1998).

D.V. Leff et al, "Thermodynamic Control Of Gold Nanocrystal Size: Experiment And Theory", The Journal of Physical Chemistry, vol. 99, pp. 7036–7041 (May 4, 1995).

J.D.L. Holloway et al, "Electron–Transfer Reactions Of Metallocenes: Influence Of Metal Oxidation State On Structure And Reactivity", Journal of the American Chemical Society, vol. 101, pp. 2038–2044 (Apr. 11, 1979).

C. Mead et al, "Introduction to VLSI Systems", Addison–Wesley, Ch. 3, Section 10, pp. 79–82 (1980).

C.P. Collier et al, "Electronically Configurable Molecular–Based Logic Gates", Science, vol. 285, pp. 391–394 (Jul. 16, 1999).

K. Matsumoto et al, "Room Temperature Operation Of A Single Electron Transistor Made By The Scanning Tunneling Microscope Nanooxidation Process For The TiOx/Ti System", Applied Physics Letters, vol. 68, No. 1, pp. 34–36 (Jan. 1, 1996).

E.S. Snow et al, "Single–Atom Point Contact Devices Fabricated With An Atomic Force Microscope", Applied Physics Letters, vol. 69, No. 2, pp. 269–271 (Jul. 8, 1996).

R. Garcia et al, "Local Oxidation Of Silicon Surfaces By Dynamic Force Microscopy: Nanofabrication And Water Bridge Formation", Applied Physics Letters, vol. 72, No. 18, pp. 2295–2297 (May 4, 1998).

S. Gwo et al, "Local Electric–Field–Induced Oxidation Of Titanium Nitride Films", Applied Physics Letters, vol. 74, No. 8, pp. 1090–1092 (Feb. 22, 1999).

R. Armitage et al, "Solid–State Gadolinium–Magnesium Hydride Optical Switch", Applied Physics Letters, vol. 75, No. 11, pp. 1863–1865 (Sep. 27, 1999).

* cited by examiner

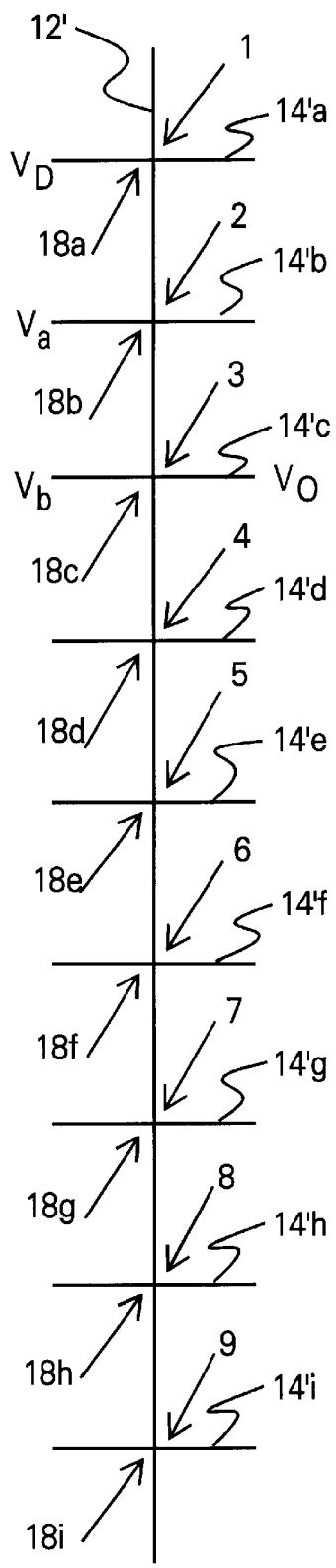
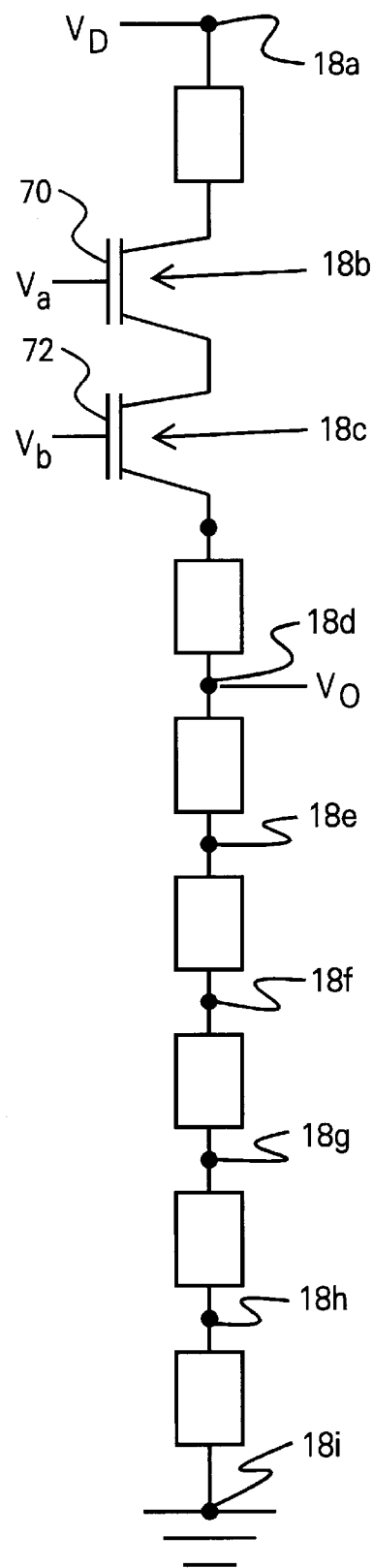
FIG. 9a
FIG. 9b

CONFIGURABLE NANOSCALE CROSSBAR ELECTRONIC CIRCUITS MADE BY ELECTROCHEMICAL REACTION

CROSS-REFERENCE TO RELATED APPLICATIONS

The present application is a continuation-in-part of application Ser. No. 09/280,225, entitled "Molecular Wire Crossbar Interconnect (MWCI) for Signal Routing and Communications", filed on Mar. 29, 1999, now U.S. Pat. No. 6,314,019, issued Nov. 6, 2001. The present application is also related to application Ser. No. 09/282,048, entitled "Chemically Synthesized and Assembled Electronic Devices", filed on Mar. 29, 1999, which is directed to the formation of nanowires used for nanoscale computing and memory circuits. The present application is further related to applications Ser. No. 09/282,045, entitled "Molecular Wire Crossbar Logic (MWCL)"; Ser. No. 09/280,189, entitled "Molecular Wire Crossbar Memory", now U.S. Pat. No. 6,128,214, issued Oct. 3, 2000; and Ser. No. 09/280,188, entitled "Molecular Wire Transistor (MWT)", all also filed on Mar. 29, 1999, which are all directed to various aspects of memory and logic circuits utilized in nanocomputing.

TECHNICAL FIELD

The present invention is generally directed to nanoscale computing and memory circuits, and, more particularly, to the electrochemical modification of nanowires and junctions between nanowires to optimize their properties for electronic circuit applications.

BACKGROUND ART

Above-referenced application Ser. No. 09/280,225 discloses and claims the fabrication of the nanoscale defect-tolerant and configurable devices by forming nanoscale crossbars first, and then configuring the electronic properties of the devices at each cross-point or intersection. It has also been proposed to use configurable molecules between the cross lines to control the electronic properties; see also above-referenced application Ser. No. 09/282,048.

The above-referenced patent applications are directed to the formation of a configurable film at the cross-points, such as a switchable molecule, an example of which is rotaxane. Investigations continue to develop new and different ways of configuring the crossbars, in an effort to provide improved performance.

DISCLOSURE OF INVENTION

In accordance with the present invention, configurable circuits comprise arrays of cross-points of one layer of metal or semiconductive nanoscale lines, or wires, crossed by a second layer of metal or semiconductive nanoscale lines, or wires, with a configurable layer between the lines. Methods are provided for altering the thickness and/or properties of the wires and the configurable layer by oxidation or reduction methods, employing a solid material as the configurable layer.

Specifically, a method is provided for configuring nanoscale devices in a crossbar array of a first layer of nanoscale lines comprising a first metal or a first semiconductor material crossed by a second layer of nanoscale lines comprising a second metal or a second semiconductor materials. The method comprises:

(a) forming the first layer of nanoscale lines on a substrate;

(b) forming a solid phase configurable layer on the first layer at least in areas where the nanoscale lines of the second layer are to cross the nanoscale lines of the first layer;

(c) forming the second layer of nanoscale lines on the configurable layer, crossing over the first layer of nanoscale lines; and (d) changing a property of the lines and/or configurable layer by oxidation or reduction to thereby configure the nanoscale devices to form logic and/or memory circuits. Examples of properties that may be changed include thickness, electronic properties, such as conductivity (resistivity), barrier height, capacitance, band gap, etc.

BRIEF DESCRIPTION OF THE DRAWINGS

FIG. 8b is a circuit diagram of the schematic diagram of FIG. 8a;

FIG. 9a is a schematic diagram depicting the formation of another logic element, specifically, an AND gate, in accordance with the teachings of the present invention; and FIG. 9b is a circuit diagram of the schematic diagram of FIG. 9a.

BEST MODES FOR CARRYING OUT THE INVENTION

Definitions

Figure 1:
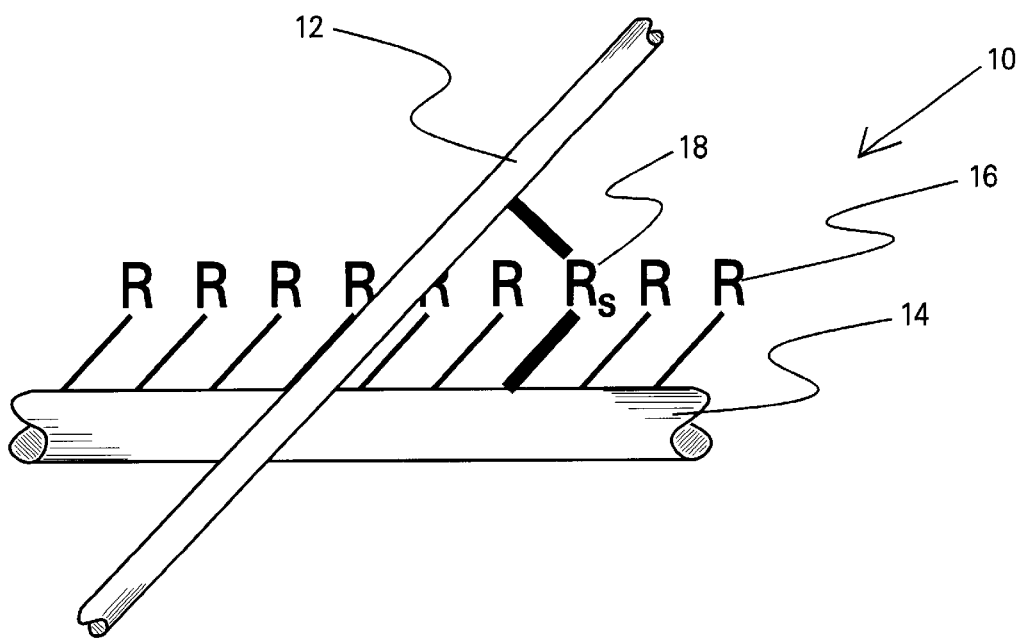
FIG. 1 is a schematic representation of two crossed nanoscale wires, with a configurable connection between the wires.

As used herein, the term "self-aligned" as applied to "junction" means that the junction that forms the switch, transistor, and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a configurable material can change its state only once via an irreversible process such as an oxidation or reduction reaction; such a switch can be the basis of a programmable read only memory (PROM), for example.

The term "reconfigurable" means that a configurable material can change its state multiple times via a reversible process such as an oxidation or reduction; e.g., the configurable material can be switched open and close multiple times such as the memory bits in a random access memory (RAM).

Micron-scale dimensions refers to dimensions that range from 1 micrometer to a few micrometers in size.

Sub-micron scale dimensions refers to dimensions that range from 1 micrometer down to 0.01 micrometer.

Nanometer scale dimensions refers to dimensions that range from 1 nanometer to 10 nanometers (0.01 micrometer).

Micron-scale (or submicron-scale) wires refer to rod or ribbon-shaped conductors or semiconductors with widths or diameters having dimensions that can range from submicron-scale to micron-scale, and lengths of several micrometers and longer.

Nanoscale wires refer to rod or ribbon-shaped conductors or semiconductors with widths or diameters having dimensions of nanometer scale and lengths of micronscale or longer.

A crossbar is an array of configurable materials that connect each wire in one set of parallel wires to every member of a second set of parallel wires that intersects the first set (usually the two sets of wires are perpendicular to each other, but this is not a necessary condition).

Crossed Wire Switch

In related patent application Serial No. 09/282,048, a basic scheme for chemically synthesized and assembled electronic devices is provided. That application discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

The essential device features are shown in FIG. 1. A crossed wire switch 10 comprises two wires 12, 14, each either a metal or semiconductor wire, that are crossed at some non-zero angle. In between those wires is a layer of molecules or molecular compounds 16, denoted R in FIG. 1. The particular molecules 18 (denoted $R_s$) that are sandwiched at the intersection, or junction, of the two wires 12, 14 are identified as switch molecules. When an appropriate voltage is applied across the wires, the switch molecules are either oxidized or reduced. In all cases, oxidation or reduction will affect the tunneling distance, the tunneling barrier height, and/or the molecular energy levels of the switch molecules between the two wires, thereby exponentially altering the rate of charge transport across the wire junction, and serving as the basis for a switch.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I-V characteristic enables devices to be altered after they are built and may provide new and useful functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

Previously-Disclosed Crossbar

Figure 2:
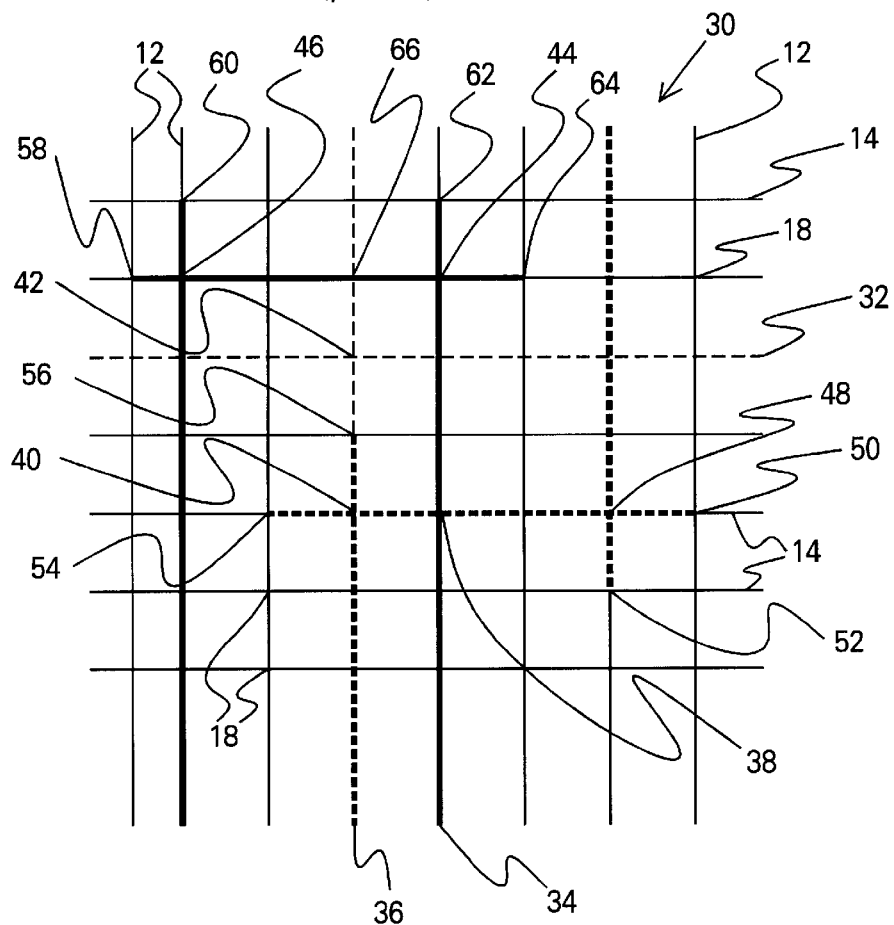
FIG. 2 is a schematic diagram depicting a crossbar interconnect and showing the features that enable construction of an arbitrarily complex integrated circuit by making connections between wires in different layers and by opening gaps in wires within each layer.

FIG. 2 presents one embodiment of a crossbar 30 disclosed in the above-referenced application Ser. No. 09/280, 225. The crossbar consists of a layer of vertical nanowires 12 and a layer of horizontal nanowires 14. Junctions 18 are formed where the vertical wires 12 and the horizontal wires 14 cross. Distinct electrical nets (one indicated by dashed lines 32, one indicated by heavy solid lines 34, and one indicated by dotted lines 36) may be created in the crossbar 30 as part of the integrated circuit. These separate circuits 32, 34, 36 can cross each other without being electrically connected where a crossbar switch is open, denoted 38 (not conducting current). Alternatively, horizontal and vertical wires may be electrically connected by switches that are closed, denoted 40, 42, 44, 46, 48. Circuits may be confined to segments of horizontal or vertical crossbar wires by controlled oxidation of a nanowire to make an electrically open switch, denoted 50, 52, 54, 56, 58, 60, 62, 64. By using the voltage across the electrochemical cell formed by each pair of crossed nanowires to make and break electrical connections both along wires in a layer (segmented wires) and between wires in two layers (vias), one can create an integrated circuit of arbitrarily complex topology. The wires may connect to an electronic device (e.g., resonant tunneling diode or transistor) (not shown) external to the crossbar array 30. (The formation of transistors is disclosed and claimed in copending application Ser. No. 09/280,188.) Alternatively, two or more nets, e.g., 32, 34 may connect to an electronic device 66 (e.g., resonant tunneling diode or transistor) internal to the crossbar array 30. In the circuit depicted in FIG. 2, it is to be understood that all pairs of wires 12, 14 which cross will have the switch 18 between them open unless it specifically intended to be closed by the design of the integrated circuit. The freedom of a circuit designer to arbitrarily select the mixture of device types and interconnect topologies (of which FIG. 2 only shows arbitrary examples) makes the present invention valuable.

While the discussion with respect to FIG. 2 is specifically directed to nanoscale wires (wires having a diameter on the order of nanometers or tens of nanometers), the same considerations may be employed in the utilization of micron-scale wires (wires having a diameter on the order of micrometers or sub-micrometers). In either case, the operation of the junction 18 is dependent on a molecular species, which provides a device that is measured in terms of nanometers in its functional dimension.

Present Invention

Figure 3:
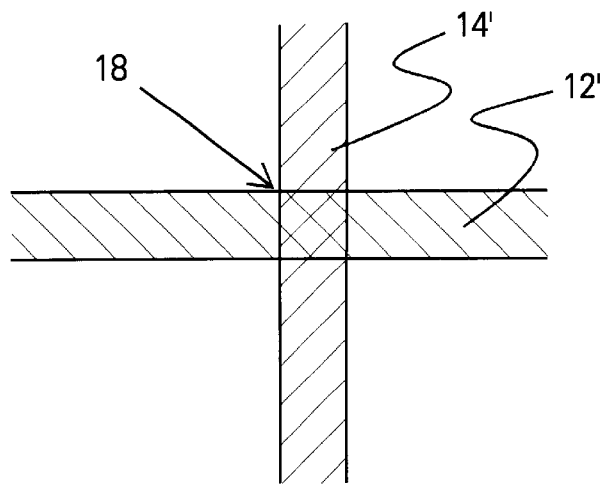
FIG. 3 is a top plan view of a single cross-point of the present invention.
Figure 4:
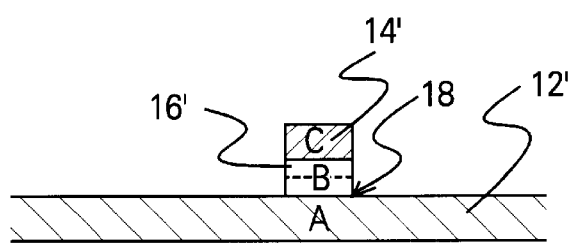
FIG. 4 is a side elevational view of the cross-point of FIG. 3, showing two layers of nanoscale lines, each of which can independently be semiconductor or metal, separated by a layer of configurable material, e.g., oxide.

In the present application, a different method than that described above is used to configure the electronic properties of a crossbar device 30. As shown in FIG. 3 and FIG. 4, metal or semiconductor (hereinafter denoted "metal/semiconductor") lines 12' are fabricated, then metal/semiconductor cross lines 14', orthogonal to the semiconductor lines, are fabricated at nanoscale dimensions. Between the metal/semiconductor lines 14' and the metal/semiconductor lines 12', a configurable layer or stack of layers 16' is sandwiched, as shown in FIG. 4. Either or both of the lines 12', 14' may, in most cases, independently be metal or semiconductor, thus giving rise to metal-semiconductor, metal-metal, and semiconductor-semiconductor contact devices. The configurable layer or layers 16' may be formed either by chemically altering a region of one or both of the lines 12', 14', such as by oxidation, or may be separately formed, such as by deposition, after forming the lines 12' and before forming the lines 14'.

The electronic properties at the cross-point 18 between the two lines 12', 14' can be controlled by adjusting a property of the configurable layer 16', for example, the thickness of a region of insulation in the configurable layer 16'. When the insulator (such as oxide) region thickness is zero, then the metal/semiconductor 14' contacts directly to metal/semiconductor 12', and the contact region 18 between the metal/semiconductor 12' and the metal/semiconductor 14' will either form an ohmic contact to have linear I–V (current-voltage) electrical properties or form a Schottky contact to have rectified I–V electrical properties. The combinations thus include metal-insulator-semiconductor, metal-insulator-metal, and semiconductor-insulator-semiconductor devices.

When the thickness of the insulator (I) region in the configurable layer 16' is increased to forbid the direct current flow, but allow the tunneling current to flow between lines 12' and 14', where one of the sets of lines 12', 14' is metal or semiconductor and the other set 14', 12' is metal, then it will form a MIM (metal-insulator-metal) or a MIS (metal-insulator-semiconductor) tunnel diode. The diode resistance can be controlled by the thickness of the insulator region.

When the thickness of the insulator region in the configurable layer 16' is further increased to forbid the tunneling current, but the electric field between lines 12' and 14', where one of the sets of lines 12', 14' is metal or semiconductor and the other set 14', 12' is semiconductor, can control the carrier density and current in the semiconductor line', then a MOS-like (metal-oxide-semiconductor) transistor can be formed.

When the thickness of the insulator region in the configurable layer 16' thickness is still further increased by consuming the metal/semiconductor 14' or metal/semiconductor line 12' thickness in different layers from each other, then it can not only isolate the lines, but also break the metal/semiconductor lines to yield two isolated wires in the same layer. The advantage of this is discussed further below.

A crucial step is how to configure the thickness of the insulator region in the configurable layer 16' at each individual cross-point 18 and how to consume the metal and/or semiconductor wires to break the wires.

One method for controlling the insulator layer thickness at each individual cross-point 18 is to use an electrochemical method to oxidize or reduce the configurable materials 16' at the region 18 where the wires 12' and 14' cross to increase or decrease the thickness of the configurable layer or layers 16'. The thickness change can be controlled by applying a voltage between the metal/semiconductor lines 12' and 14' and measuring the total charge that flows through the junction to determine the amount of material that is oxidize or reduced. In addition, the current-voltage characteristics of the junction 18 can be used to determine when the configurable layer or stack of layers has reached the desired thickness in situ.

Consider the situation in which an insulator layer is sandwiched between semiconductor layers 12' (A) and 14' (C) as shown in FIG. 4. When a voltage V is applied to both 12' and 14', if V exceeds the standard oxidation potential for the reaction involving layer 16' (B) with a species in solution into which the entire system has been immersed, but V is less than the standard oxidation potential for the reactions involving either A or C with the same species in solution, then B will be oxidized while A and C remain inert, and the thickness of the oxidation layer 16' will increase.

However, if a positive voltage is applied to A and C, then the reaction will be reversed, the oxide of material B will be reduced, and the thickness of the oxidation layer will decrease. When the oxide layer 16' is thin enough, current can tunnel from A to C, and when the oxide of material B is completely reduced, it will become a conductor and allow current to flow from A to C through B.

In one embodiment of the present invention, a thin layer 16' of a metal or semiconductor (B) is sandwiched between metal or semiconductor layers 12' and 14' (A and C, respectively). The layer B 16' comprises a metal or metal alloy, such as aluminum, titanium, tungsten, molybdenum, nickel, gadolinium, erbium, and titanium nitride, or a semiconductor such as silicon or germanium. However, the present invention is not limited to these specific metals and semiconductors. The layer 16' is then exposed to a chemical reactive environment such as a chemical solution or a reactive gas. Examples of suitable chemical solutions include aqueous solutions containing at least one of hydroxide, ammonium, and hydrogen ions, while examples of reactive gases include oxygen, nitrogen, ammonia, methane, and air with water vapor. In this instance, if a metal layer is used for nanoscale lines 14', it is non-oxidizable. Examples of such non-oxidizable metals include, but are not limited to, gold, platinum, chromium, tantalum, nickel, palladium, and copper.

Figure 5:
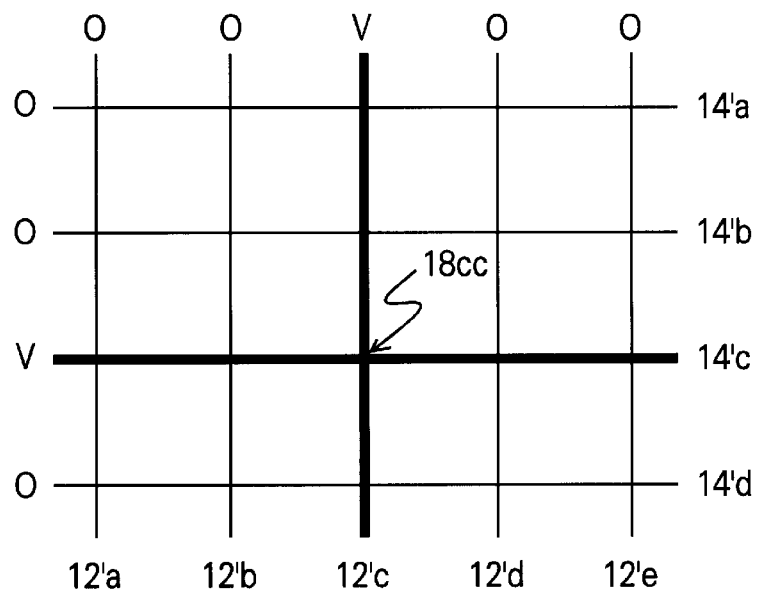
FIG. 5 is a side elevational view of the cross-point of FIG. 3, depicting a specific embodiment for controlling oxide thickness by an oxidation and reduction process.
Figure 6:
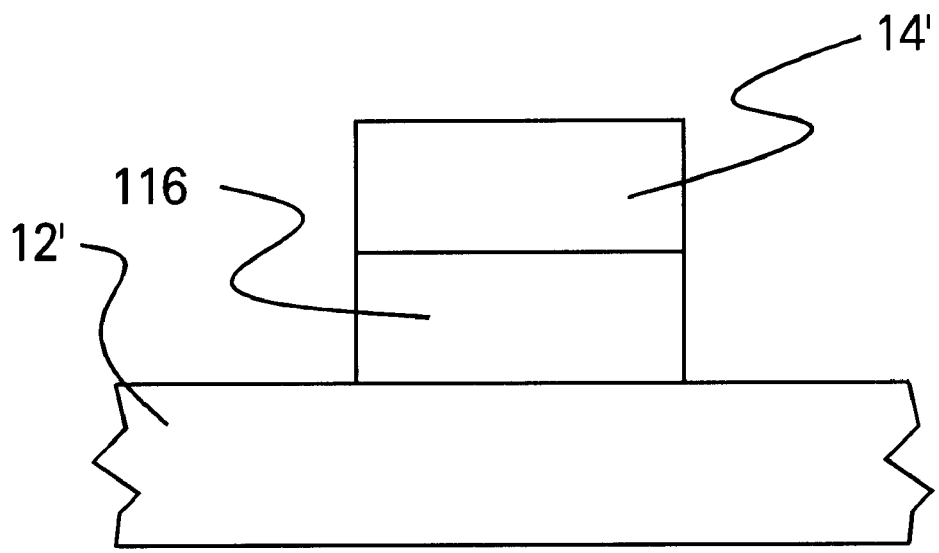
FIG. 6 is a side elevational view of the cross-point of FIG. 3, depicting another specific embodiment for controlling the configurable layer by an oxidation and reduction process.

For a crossbar network, the insulator layer at each cross-point 16 can be modulated independently by applying a voltage V at the two wires leading to the cross-point but grounding the rest of the wires, as illustrated in FIG. 5, while immersing the circuit in an appropriate solution and providing a counter electrode for the electrochemical reaction. Thus, for example, wires 12'a, 12'b, 12'd, 12'e, 14'a, 14'b, and 14'd are grounded (0 V), and wires 12'c and 14'c have a voltage (V) applied to them.

This oxidation process is possible for almost all non-noble materials such as titanium (see, e.g., K. Matsumoto et al, *Applied Physics Letters*, Vol. 68, no. 1, pp. 34–36 (Jan. 1, 1996)) and aluminum (see, e.g., E. S. Snow et al, *Applied Physics Letters*, Vol. 69, no. 2, pp. 269–271 (Jul. 8, 1996)), semiconductors such as Si (see, e.g., R. Garcia et al, *Applied Physics Letters*, Vol. 72, no. 18, pp. 2295–2297 (May 4, 1998)), and compounds such as TiN (see, e.g., S. Gwo et al, *Applied Physics Letters*, Vol. 74, no. 8, pp. 1090–1092 (Feb. 22, 1999)).

As demonstrated by nano-oxidation experiments induced by a scanning tunneling tip, the oxidation layer thickness can range from sub-nanometer to a few tens of nanometers. The voltage applied between the tip and sample ranges from a few volts to a few tens of volts. The oxidation usually occurred in water or air with a prescribed humidity. The inert electrodes can be Si, Pt, or even Ti, although the present invention is not so limited.

Figure 7:
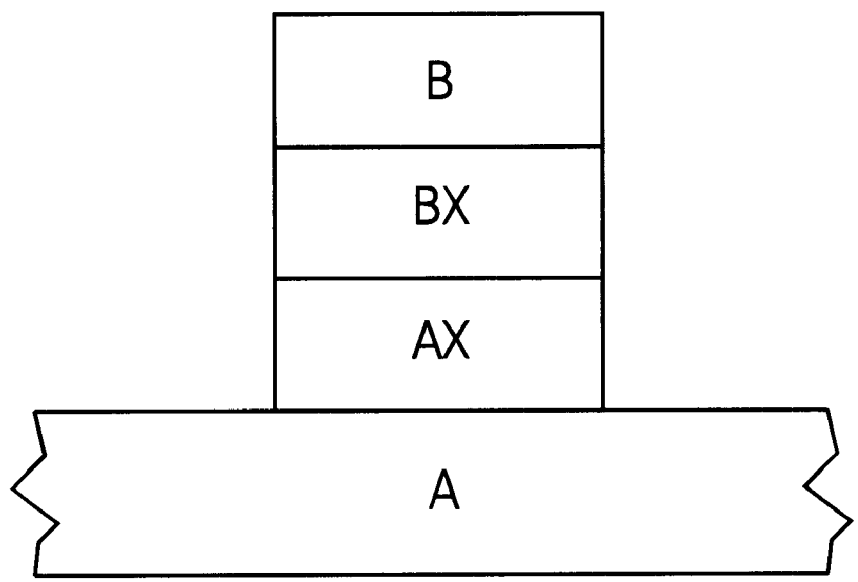
FIG. 7 is a side elevational view of the cross-point of FIG. 3, depicting a solid phase reaction between two wires.

Another method is to use a solid-solid oxidation and reduction process to change the thickness of the insulator layer. For example, an electrochemical reaction can also occur in the solid phase between A/AX//BX/B, the structure of which is depicted in FIG. 7, such as $$A + BX \leftrightarrows AX + B \tag{1}$$

by applying a voltage between A and B, where X represents a negative ion, such as oxygen or nitrogen ion, when the voltage is larger than the difference of standard oxidation potential between A and B.

The reaction can also be reversed when a voltage of the opposite polarity is applied. The electronic properties of the oxidation products of A and B can be very different. Therefore, such a reaction can modulate the conductivity between A and C, change the transistor properties, and even break an A wire when material A is oxidized completely.

Another method is to use the well-known metal/hydride reversible cycle (see, e.g., R. Armitage et al, *Applied Physics Letters*, Vol. 75, no. 11, pp. 1863–1865 (Sep. 27, 1999). It has been shown that the conductivity of metal can be controlled by absorbing/desorbing hydrogen. Also, the change of the hydrogen concentration in the metal can be controlled by applying a certain voltage between the metal/semiconductor lines 14' and metal/semiconductor lines 12' and hydrogen contained in solution. By varying the voltage current at each cross-point 18, the resistivity of the metal hydride layer can be modulated.

For the metal/hydride transition, a metal layer 116 is provided between metal/semiconductor lines 12' and metal/semiconductor lines 14', as shown in FIG. 5. The metal layer 116 can be transformed to metal hydride, or visa versa, by absorbing/desorbing hydrogen from a solution containing hydrogen or from a solid hydrogen source by applying a voltage between the metal/semiconductor lines 14' and the metal/semiconductor lines 12'. As is well-known, a voltage of one polarity will cause absorption of hydrogen, while a voltage of the opposite polarity will cause desorption of hydrogen. The voltage is in the range of 1 to 10 V. The thickness of the metal hydride ranges from a few nanometers to the submicron range. Solutions containing hydrogen and solid hydrogen sources for converting a metal to a hydride are well-known. Examples of metals used in metal layer 116, which are capable of forming hydrides, include transition metals, rare earth metals, alkali metals, and alkaline earth metals, as is well-known.

Although the thickness of the metal hydride layer 116 may not change during the absorption/desorption process, the resistance of the metal hydride layer changes greatly (>3 orders of magnitude) to change the conductivity and electric properties between metal/semiconductor lines 14' and metal/semiconductor lines 12' to form different devices. Changing the conductivity between the wires 12', 14' permits formation of MOS devices, for example, due to the formation of an insulating layer between a metal line and a semiconductor line.

Figure 8A:
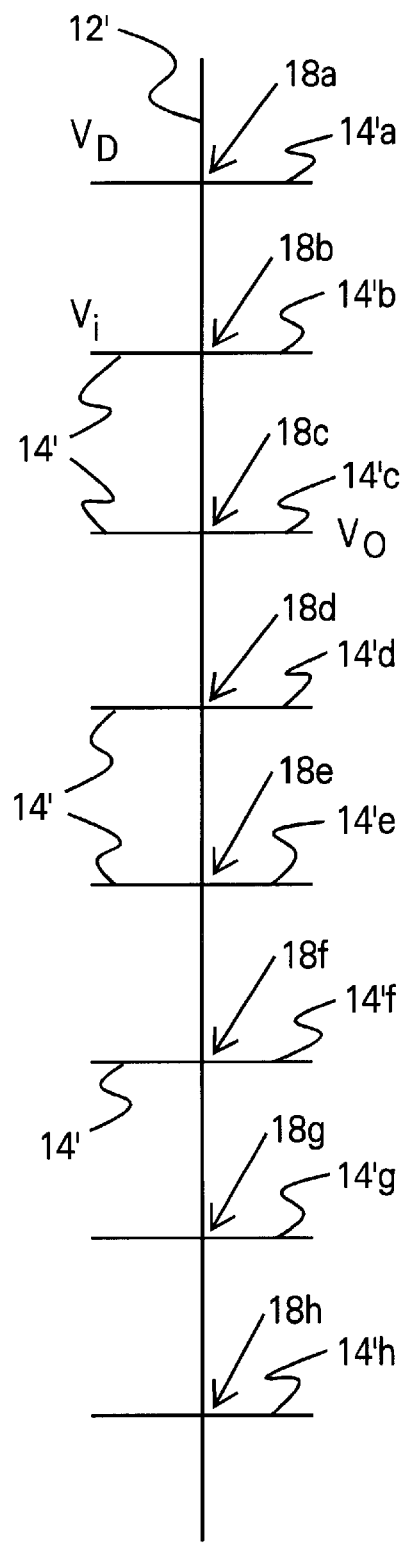
FIG. 8a is a schematic diagram depicting the formation of a logic element, specifically, a NOT gate, in accordance with the teachings of the present invention.
Figure 8B:
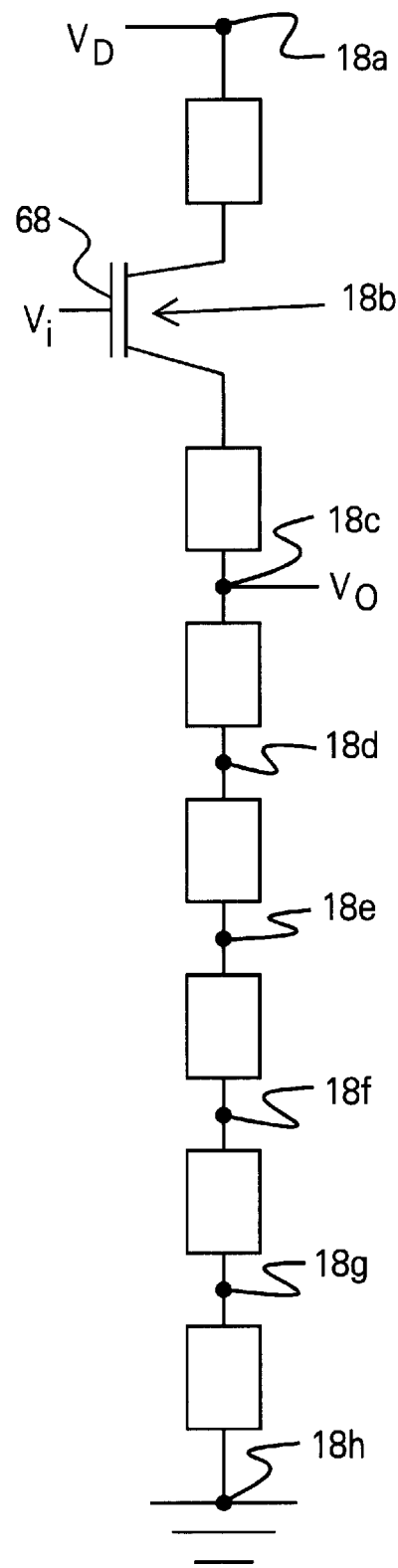

Turning now to practical uses of the invention and recalling the discussion above regarding the conditions for the formation of transistors, FIG. 8a depicts an example in which a semiconductor wire 12' is crossed by eight metal/semiconductor lines 14' (14'a–14'h). The semiconductor lines 12' and metal/semiconductor lines 14' are configured to ohmic contact (shorted) at cross-points 18a, 18c, and 18h, while kept open at cross-points 18d, 18e, 18f, and 18g. An enhancement mode transistor 68 is formed between the semiconductor 12' and metal/semiconductor 14'b at point 18b. The group of semiconductor and metal/semiconductor wires can form a circuit with an equivalent circuit as shown in FIG. 8b. When a voltage $V_D$ is applied at cross-point 18a and cross-point 18h is grounded and $V_I$ at line 14b is higher than the transistor threshold voltage, then the transistor is open and the output voltage $V_o$ at cross-point 18c is equal to zero. When $V_I$ is lower than the transistor threshold voltage, then the transistor is conducting and $V_o$ is (5/7) $V_D$, that is, $V_O$ is high. This forms a basic logic element, a NOT gate for logic functions.

In a similar way, as shown in FIGS. 9a and 9b, an AND logic gate can be formed by shorting cross-points 18a, 18d, and 18i, opening cross-points 18e, 18f, 18g, and 18h, and making enhancement mode transistors 70, 72 at points 18b and 18c.

The other types of logic elements can be formed in a similar way by configuring the electronic properties at the cross-points 18 of the crossbar circuits.

One advantage is that simple crossbar networks can be formed without alignment and configured into the desired circuits at a later time, which is especially important for nanoscale electronic circuits where the accurate alignment and fabrication steps can become extremely complex or even impossible.

Another advantage is that the circuits contain all the basic elements—resistors and transistors with gain—for logic and memory circuits.

Yet another advantage is that the circuit is defect-tolerant. For a discussion of defect-tolerant structures, see, e.g., J. R. Heath, et al, "A Defect-Tolerant computer Architecture: Opportunities for Nanotechnology", *Science*, Vol. 280, pp. 1716–1721 (Jun. 12, 1998).

The following material is directed to breaking a semiconductor wire at certain cross-points in a crossbar network. For a semiconductor wire, a hole (h$^+$) is needed to break the bonding between the semiconductor atoms. For example,

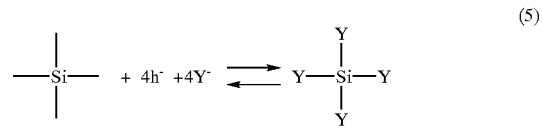
(5)

where Y is an appropriate insulator-forming substance, such as oxygen.

By controlling the hole concentration and current at a local cross-point, the section of the wire can be broken, such as by electrochemical etching, or can be connected, such as by electrochemical deposition.

For example, for an n-type semiconductor wire 14' crossing a metal wire 12', the hole concentration in wire 14' can be adjusted at the cross-point 18 between wires 12' and 14' by applying a voltage at wire 12' to reverse the carrier concentration (to p-type) at the cross-point, which will make the reaction (5) happen at the local cross-point to etch wire 14'; see, e.g., FIG. 5. If a reverse voltage is applied at wire 12', then the reaction (5) occurs in the reverse direction, and electrochemical deposition will connect the wire 14' at the cross-point 18.

To break a metal wire 14' at the cross-point 18 with wire 12', a voltage can be applied at wire 12' to create a strong local field in wire 14' at the cross-point. When the electrical field exceeds the threshold field, electrochemical anodization will cause oxidation at the cross-point to break wire 14'; see, e.g., FIG. 5.

As stated above, one can use oxidization/reduction processes to control the thickness of the metal oxide layer 16' between the semiconductor layer 12' and a conductive layer 14' for nanoscale device application (see FIGS. 3–4). The reaction between the sandwiched metal and oxygen ions (or other kinds of cations) is influenced by the potential on the metal 14' and the oxygen density on the metal surface.

Metals useful as nanoscale lines 12', 14' include, but are not limited to, aluminum, titanium, tungsten, molybdenum, gadolinium, erbium, and titanium nitride. Semiconductors useful as nanoscale lines 12', 14' include, but are not limited to, silicon, germanium, gallium arsenide, and indium phosphide.

The configurable materials 16' useful in the practice of the present invention include metal ceramics, such as metal oxides, metal nitrides, metal borides, metal carbides, and metal hydrides, and semiconductor insulators, such as semiconductor oxides, e.g., $SiO_2$, and semiconductor nitrides, e.g., $Si_3N_4$. However, the present invention is not limited to these enumerated species.

As indicated above, a suitable voltage and current may be applied between the two sets of lines 12' and 14' to change the thickness of the configurable material or otherwise alter a property, e.g., thickness, electronic properties, such as conductivity (resistivity), barrier height, capacitance, band gap, etc. The voltage and current are within the range of oxidation and reduction potentials for such configurable materials, usually 0 to about 100 volts.

What is claimed is:

1. A method for configuring nanoscale devices in a crossbar array of configurable devices comprising arrays of cross-points of a first layer of nanoscale lines comprising either a first metal or a first semiconductor material crossed by a second layer of nanoscale lines comprising either a second metal or a second semiconductor material, said method comprising:
   (a) forming said first layer on a substrate;
   (b) forming a solid phase of a configurable material on said first layer at least in areas where said second layer is to cross said first layer;
   (c) forming said second layer on said configurable material, over said first layer; and
   (d) changing a property of said configurable material to thereby configure said nanoscale devices.

2. The method of claim 1 wherein said metal is selected from the group consisting of aluminum, titanium, tungsten, molybdenum, nickel, gadolinium, erbium, and titanium nitride.

3. The method of claim 1 wherein said semiconductor material is selected from the group consisting of silicon, germanium, gallium arsenide, and indium phosphide.

4. The method of claim 1 wherein said configurable material is selected from the group of (a) metal ceramics consisting of metal oxides, metal nitrides, metal borides, metal carbides, and metal hydrides for a reversible metal to metal ceramic transformation and (b) semiconductor insulators consisting of semiconductor oxides and semiconductor nitrides for a reversible semiconductor to semiconductor insulator transformation.

5. The method of claim 4 wherein at least one of said metal ceramic and said semiconductor insulator has a thickness that is changed by one of the following methods: (a) applying a voltage and a current between said first layer of nanoscale lines and said second layer of nanoscale lines to oxidize or reduce either or both said layers of lines; (b) forming a third layer of a metal or semiconductor material between said first layer of nanoscale lines and said second layer of nanoscale lines, said third layer of metal or semiconductor material able to react with an insulator-forming environment to form said configurable material, with said second layer of nanoscale lines being non-oxidizable; (c) providing an insulator-forming environment to said third layer of metal or semiconductor material, and applying a voltage and a current between said first layer of lines and said second layer of lines to cause said third layer of metal or semiconductive material to react with said insulator-forming environment to form said configurable material; and (d) applying a reverse voltage and current to reduce said configurable material.

6. The method of claim 5 wherein the amount of material that is oxidized or reduced can be determined by the total charge that flows through said junction or by the current-voltage characteristics of said junction to thereby determine when said configurable material has achieved a desired thickness.

7. The method of claim 5 wherein in part (a), said voltage and said current are within the range of oxidation and reduction potential values of said configurable materials.

8. The method of claim 5 wherein in part (c), said second non-oxidizable nanoscale lines comprise a material selected from the group consisting of inert metals and semiconductors and their alloys.

9. The method of claim 8 wherein said inert metals are selected from the group consisting of gold, platinum, chromium, tantalum, nickel, palladium, and copper and wherein said inert semiconductors are selected from the group consisting of silicon and germanium.

10. The method of claim 8 wherein said insulator-forming environment is selected from the group consisting of chemical solutions and reactive gases.

11. The method of claim 10 wherein said chemical solutions are selected from the group consisting of aqueous solutions containing at least one of oxygen, nitrogen, and hydrogen ions and wherein said reactive gases are selected from the group consisting of oxygen, nitrogen, boron, carbon, and air with water vapor.

12. The method of claim 8 wherein said voltage and said current are within the range of oxidation and reduction potential values of said configurable materials.

13. The method of claim 4 wherein said configurable material consists essentially of a metal oxide or a semiconductor oxide.

14. The method of claim 4 wherein said configurable material consists essentially of a metal hydride.

15. The method of claim 14 wherein said metal hydride has a resistivity that is varied by absorbing and desorbing hydrogen as needed.

16. The method of claim 15 wherein said absorbing and desorbing is achieved by applying a voltage between said layer of semiconductive nanoscale lines and said layer of metal nanoscale lines.

17. The method of claim 16 wherein said applied voltage is within the range of 1 to 100 volts for adsorbing and desorbing hydrogen.

18. The method of claim 14 wherein said metal hydride layer has a thickness within the range of a few nanometers to submicrons.

* * * * *